United States Patent [19]
Torii

[11] Patent Number: 4,751,497
[45] Date of Patent: Jun. 14, 1988

[54] DIGITAL TO ANALOG CONVERTER WITH HIGH OUTPUT COMPLIANCE

[75] Inventor: Toshihiro Torii, Koganei, Japan

[73] Assignee: Iwatsu Electric Co., Ltd., Tokyo, Japan

[21] Appl. No.: 853,688

[22] Filed: Apr. 18, 1986

[30] Foreign Application Priority Data

Apr. 24, 1985 [JP] Japan .................................. 60-87849

[51] Int. Cl.$^4$ .............................................. H03M 1/78
[52] U.S. Cl. .............................................. 340/347 DA
[58] Field of Search .................................. 340/347 DA

[56] References Cited

U.S. PATENT DOCUMENTS 3,579,023 5/1971 Fox .............................. 340/347 DA

Primary Examiner—William M. Shoop, Jr.
Assistant Examiner—Richard K. Blum
Attorney, Agent, or Firm—Woodcock Washburn Kurtz Mackiewicz & Norris

[57] ABSTRACT

The disclosure relates to a digital to analog converter capable of suppressing "glitches" or transient spikes in the analog output signal. The digital to analog converter includes a plurality of current switches corresponding to the number of digital input bit signals and a resistive ladder of the conventional R-2R configuration. The R-2R ladder network has a plurality of input ports each connected to the output of a corresponding current switch. Logic inputs to the current switches determine which of the current switches are to be turned on to supply reference currents to corresponding input ports of the ladder network which in turn decrements the received reference currents by a factor of 2 as they pass through each stage to provide an analog output signal at the output terminal of the converter. To improve the accuracy of D/A conversion of the invention, compensating capacitors affording delay time equalization are provided for the least and most significant bit positions as well as between each two adjacent bit positions. These compensating capacitors operate to compensate for the stray capacitance of each current switch due to the parasitic collector-base capacitance of switching transistors to thereby equalize the impedance of the ladder network as viewed from each input port of the ladder network to the output terminal of the converter.

7 Claims, 3 Drawing Sheets

DIGITAL TO ANALOG CONVERTER WITH HIGH OUTPUT COMPLIANCE

BACKGROUND OF THE INVENTION

1. Field of the Invention

The present invention relates to digital to analog converters and, more particularly, to a digital to analog converter which can suppress "glitches" such as transient spikes and overshoots that would otherwise appear in the converter's analog output as a result of transistions in the digital input.

2. State of the Prior Art

Various digital to analog (D/A) converters have been heretofore proposed for producing an analog output from a digitally coded signal with high speed. One such converter may be comprised of a plurality of current switches, one for each bit of a digitally coded signal, which may be connected to a resistance ladder network for providing binary weighting of currents from the switches. In a typical D/A converter 10 as shown in FIG. 1, a control circuit 12 may be provided having four input terminals adapted to receive four digital input bit signals of a digital input signal. These digital input bit signals may be supplied to corresponding current switches 14, 16, 18 and 20 to selectively control the switching thereof. Each current switch may be connected to receive a reference current from a corresponding constant current source 22, 24, 26 or 28 and may have its ouput terminal connnected to a corresponding input port of an R-2R ladder network 30. The R-2R ladder network 30 may have an output port 32 which also serves as the input port associated with the most significant bit. Each current switch may have stray capacitance 36, 38, 40 or 42 between its output terminal and ground.

More specifically, the constant current sources 22 through 28 may be connected to a DC voltage supply line designated as +Vcc to receive a reference current therefrom. Each current switch may have two branches between which the reference current is steered to flow into the resistive ladder 30 or ground in response to a corresponding digital input bit signal. That is, when the digital input bit signal is at a first voltage level or at a logic 1, the current switch may be rendered conductive allowing the reference current to flow from the corresponding constant current source to the resistive ladder. On the other hand, when the bit is at a second level or at a logic 0, the current switch may be rendered non-conductive passing the reference current to ground.

The switches 14 through 20 may usually be high speed current switches which are comprised of bipolar transistors or FET's. FIG. 2 shows a typical example of prior art current switch which includes a pair of switching trransistors Q1 and Q2 arranged in left and right hand circuit branches, respectively. The switching transistor Q1 may have its emitter connected to the output of the constant current source 22, 24, 26 or 28 and its collector connected to a corresponding input port of the resistive ladder 30. The switching transistor Q2 may be connected at its emitter to the constant current source and at its collector to ground. The input to the base of transistor Q2 may be a digital input bit or logic input signal which controls the balance of flow of the reference current from the constant current source. The input to the base of transistor Q1 may be logic reference signal +Vbb which sets the threshold at which the circuit becomes unbalanced, allowing the logic input signal to change the balance of current flow from one branch of the circuit to the other. The reference current I is thereby steered between the transistors Q1 and Q2, pulling the current either to the resistive ladder 30 or to ground. When the logic input signal is at a logic 1, the transistor Q2 may turn off while the transistor Q1 may turn on, thus directing the reference current I through the left hand circuit branch to the resistive ladder 30. When a logic 0 input signal turns on the transistor Q2 and turns off the transistor Q1, the reference current from the constant current source may be supplied to ground.

Referring back to FIG. 1, the resistance network 30 may be a resistive ladder of the conventional R-2R configuration, as described above, which provides binary weighting of reference currents from the current switches 14, 16, 18 and 20. This network may have a plurality of resistors of value R, designated by reference numerals 50, 52 ane 54, each being connected between two adjacent ones of the input ports of the network. The input ports associated with the least and most significant bits may also have connected thereto another resistors of value R, designated by 56 and 58, respectively, which resistors may also be connected to ground. The remaining input ports of the network may be connected to ground through resistors of value 2R, designated by 60 and 62. With this arrangement, the network 30 decrements each reference current received from a corresponding current switch by a factor of 2 as it flows toward the output port 32. Since the input port associated with the most significant bit serves as the output port of the network, it is seen that the reference current supplied thereto carries the most weight of all the reference currents I from the current switches 14, 16, 18 and 20. All the decremented reference currents are summed as they flow toward the output port 32 to form the analog output thereat.

One of the problems associated with this conventional D/A converter is that the stray capacitance of each current switch occurring between its output terminal and ground due to the parasitic collector-base capacitance of its associated switching transistor need to be charged or discharged to accomplish switching in either direction, which would result in "glitches" in the converter output. Referring to FIGS. 3 and 4, the converter error, or glitches, due to the parasitic capacitance can be illustrated as follows: When the digital input bit signals change from 0000 to 0001, only the current switch 14 may be turned on while the remaining switches may be kept off. Assuming the absence of the stray capacitance in each current switch involved, each input port of the resistive ladder 30 would rise to a corresponding predetermined value in a step fashion. However, in actuality, each current switch has stray capacitance so that the resulting integrating action delays the rise of each input port voltage Va through Vd as shown in FIG. 3. The voltage at input port a will eventually reach a level indicated by $I \times 2/3R$, under the progressively less influence of the stray capacitances 36, 38, 40 and 42 in the order named. As is well known, the R-2R ladder network functions to decrement each reference current by a factor of 2 per stage. Accordingly, the voltages Va, Vb, Vc and Vd at input ports a, b, c and d, respectively, will rise and settle at the respective values as shown in FIG. 3.

When the digital input signal changes from 0000 to 1000, the current switch 20 may be turned on, so that the voltage of the same waveform as Va in FIG. 3 will appear at input port d. Hence, it is seen that a single bit input transition will cause variations in the time delay involved in bringing about voltage changes at the output port 32, depending upon which of the input bits makes a transition.

It will now be understood that this differential time delay associated with each bit is the cause of glitches like one 70 appearing V1, as shown in FIG. 4. FIG. 4 shows the manner in which the voltage at the output port 32 will change with a transition of the digital input from 0111 to 1000. In this Figure, voltage V2 may be the one developed at the output port when the current swtich 20 turns on, and the voltage rises gradually to $1 \times 2/3R$. The other voltage V3 may also be the one appearing at the output port 32, which reflects the turn off of the remaining current switches 14, 16 and 18. The resultant analog output voltage V1 is the sum of the voltages V2 and V3.

As seen, the resulting voltage V1 has a glitch or transient spike occurring above the level of $1 \times 2/3R$, and it is desirable to suppress such glitches to increase the compliance of the analog output voltage with a corresponding digital input.

It is therefore an object of the present invention to provide an improved digital to analog converter with a view to overcoming the above-said disadvantages or prior art device.

Another object of the present invention is to provide an improved digital to analog converter that can suppress glitches such as transient spikes and overshoots that would otherwise appear in the converter's analog output as a result of transitions in digital input bit signals.

A further object of the present invention is to suppress glitches appearing in the analog output of a digital to analog converter simply by incorporating compensating capacitors into a resistive ladder without requiring an additional glitch suppressor provided at the output of the converter.

SUMMARY OF THE INVENTION

The objects stated above and other objects in the present invention are accomplished by the provision of a digital to analog converter for converting digital input signals each including a plurality of bits, to corresponding electrical analog output signals, comprising a plurality of current switches corresponding to the number of bits of the digital input signals and selectively rendered conductive in response to digital input bit signals of a given digital input signal, means for supplying a reference current to the plurality of current switches, and an impedance network having a plurality of input ports each being connected to the output terminal of a corresponding current switch and an output port, the impedance network receiving the outputs of the current switches when the latter are rendered conductive and decrementing the respective current switch outputs as they flow toward the output port to produce an analog output signal for each digitial input signal, each current switch having a stray capacitance occurring between its output terminal and a common potential point, which capacitance causes variations in the impedance of the impedance network as viewed from each input port toward the output port, the improvement comprising means for affording impedance equalization to provide an identical time delay for the outputs of the current switches flowing through the respective input ports to the output port of the network.

In a preferred embodiment of the present invention, the impedance network comprises an R-2R ladder network including a plurality of resistors of value R each being connected between two adjacent ones of the input ports, a resistor of value R connected between the input port for the least significant bit and the common potential point, a resistor of value R connected between the input port for the most signficant bit and the common potential point, and a plurality of resistors of value 2R each being connected between a corresponding one of the input ports associated with the bit positions except the least and most significant bits and the common potential point, the input port for the most significant bit serving as the output port of the R-2R ladder network. To afford impedance equalization, a first and a second compensating capacitor of value C are connected between the input ports for the least and most significant bits, respectively, and the common potential point, and also a plurality of third compensating capacitors of value 2C are connected each in parallel to a corresponding one of the R resistors connected between two adjacent ones of the input ports, the value C being equal to the stray capacitance of each current switch connected to a corresponding input port of the R-2R ladder network.

BRIEF DESCRIPTION OF THE DRAWINGS

FIG. 3 shows the manner in which the voltages at input ports a, b, c and d of the resistive ladder will change when the current switch for the least significant bit turns on;

DESCRIPTION OF THE PREFERRED EMBODIMENT

Figure 1:
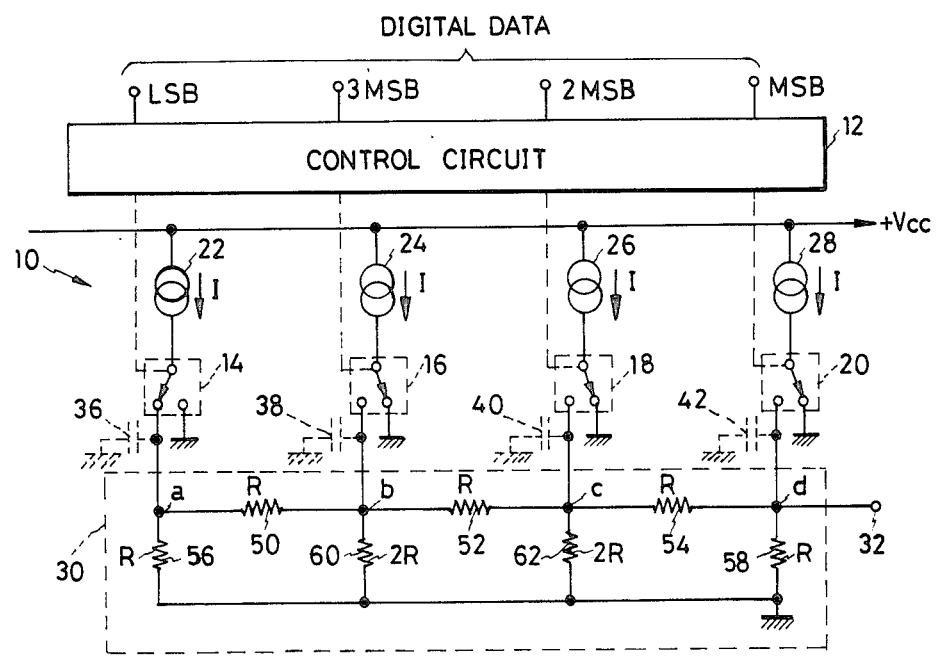
FIG. 1 is an electrical schematic of a prior art digital to analog converter utilizing a conventional R-2R ladder network in combination with a plurality of current switches.
Figure 5:
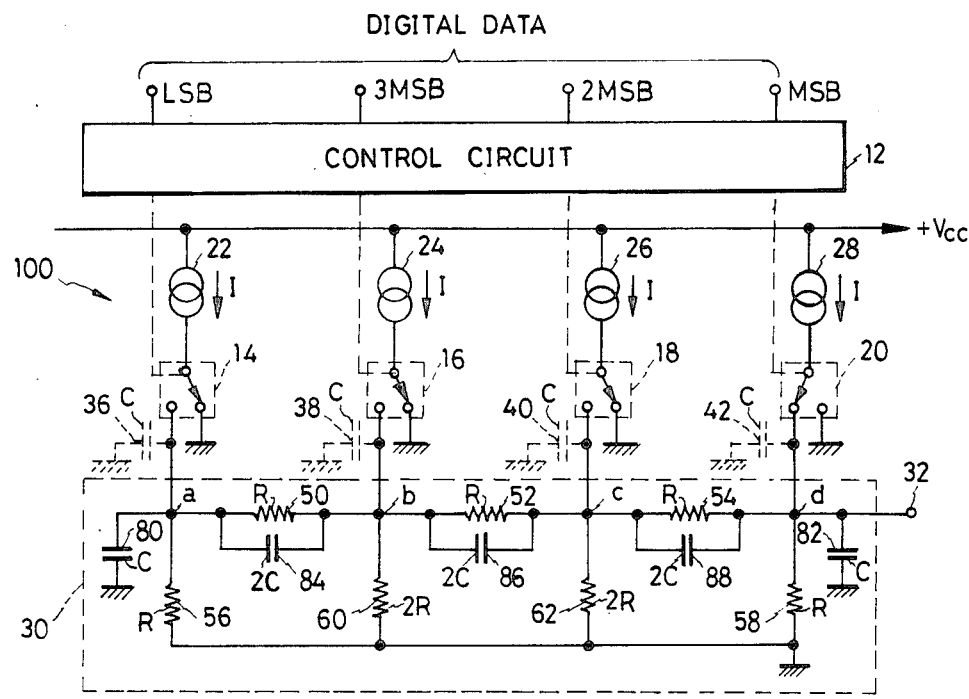
FIG. 5 is an electrical schematic of a digital to analog converter in accordance with a preferred embodiment of the present invention.
Figure 6:
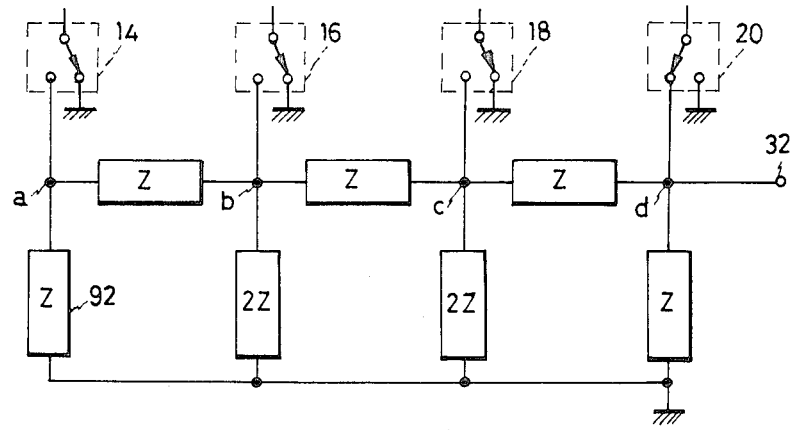
FIG. 6 is an equivalent impedance diagram of the digital to analog converter shown in FIG. 5.

Referring now to FIGS. 5 and 6, wherein like reference numerals refer to like elements in other figures, there is illustrated an improved digital to analog converter 100 constructed in accordance with a preferred embodiment of the present invention. As in the circuit arrangement of FIG. 1, the D/A converter 100 includes a control circuit 12 having input terminals adapted to receive a 4-bit digital input signal, a plurality of identical constant current sources 22, 24, 26 and 28, a plurality of identical high speed current switches 14, 16, 18 and 20 each being responsive to a corresponding logic input supplied from the control circuit 12 for allowing a reference current to flow from a corresponding constant current source to its output terminal, and a resistance ladder network 30 of the conventional R-2R configuration. Each current switch has stray capacitance 36, 38, 40 or 42 between its output terminal and ground, as described with reference to FIG. 1.

In accordance with the teaching of the present invention, there is provided for the D/A converter 100 means affording impedance equalization for the R-2R ladder network to provide an identical or uniform time delay for the outputs of the current switches flowing through the respective input ports to the output port of the network, thereby suppressing glitches or transient spikes which would otherwise appear at the analog output signal. More specifically, the R-2R ladder network 30 further includes a first and second compensating capacitor 80 and 82 of value C connected between its input ports a and d associated with the least and most significant bits, respectively, and ground. In addition, the resistive ladder includes third compensating capacitors 84, 86 and 88 of value 2C which are connected in parallel to the R resistors 50, 52 and 54, respectively. It should be noted that the capacitance value C is equal to the magnitude of the stray capacitance of each current switch 14, 16, 18 or 20 employed in the D/A converter 100 and that this value of stray capacitance is the same because of the use of substantially identical current switches.

FIG. 6 shows a simplified impedance diagram of the R-2R ladder network 30 having such compensating C and 2C capacitors incorporated therein. Considering first the R resistor 56, the compensating C capacitor 80 and the stray capacitance 36 of the current switch 14, the resultant impedance Z should be given, as follows:

$$Z = R/(1 + 2j\omega CR)$$

This resultant impedance Z is shown as an impedance block 92 in FIG. 6. In a like manner, the impedance of a parallel combination of the R resistor 50, 52 or 54 and the compensating 2C capacitor 84, 86 or 88 connected between each two adjacent input ports a, b, c and d of the network 30 is also cauculated to be equal to Z and shown as such in FIG. 6.

Considering next the input ports b and c associated with the bit positions except the least and most significant bits, the combined impedance resulting from the 2R resistor 60 or 62 connected thereto and the stray capacitance 38 or 40 of the associated current switch 16 or 18 should be: $2R/(1 + 2j\omega CR)$, and this value is equal to 2Z. This resultant impedance 2Z is shown in FIG. 6 to make the impedance network complete.

It should be understood that the impedance network shown in FIG. 6 has a specific distribution of impedances Z and 2Z that is identical to that of resistors R and 2R in the conventional R-2R ladder network. One of the important features of this impedance network is that the impedance as viewed from each input port a, b, c or d toward the output port 32 or load (not shown) connected thereto is equal to 2Z/3. Accordingly, the reference current I supplied from any current switch will develop a voltage of uniform waveform at each input port of the impedance network, irrespective of which current switch is turned on in response to corresponding digital input bit signal.

Figure 3:
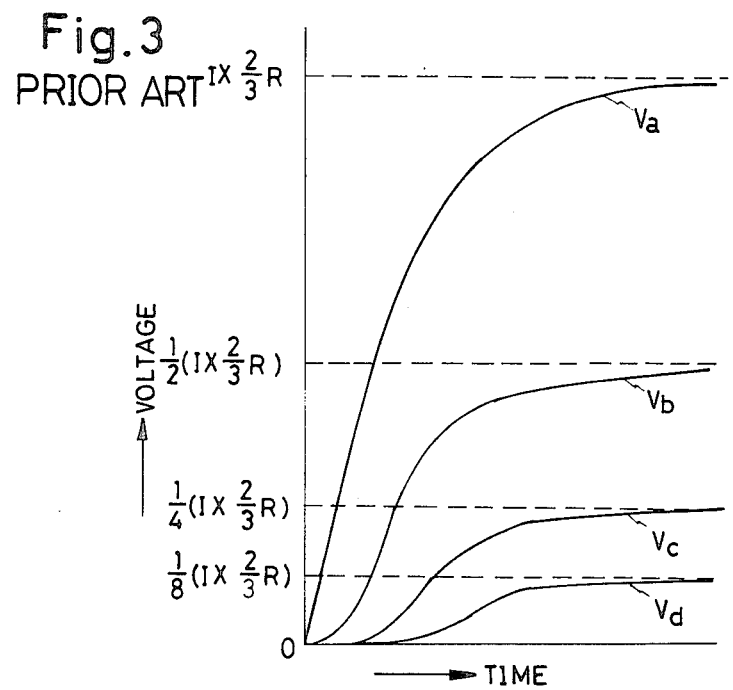
Figure 4:
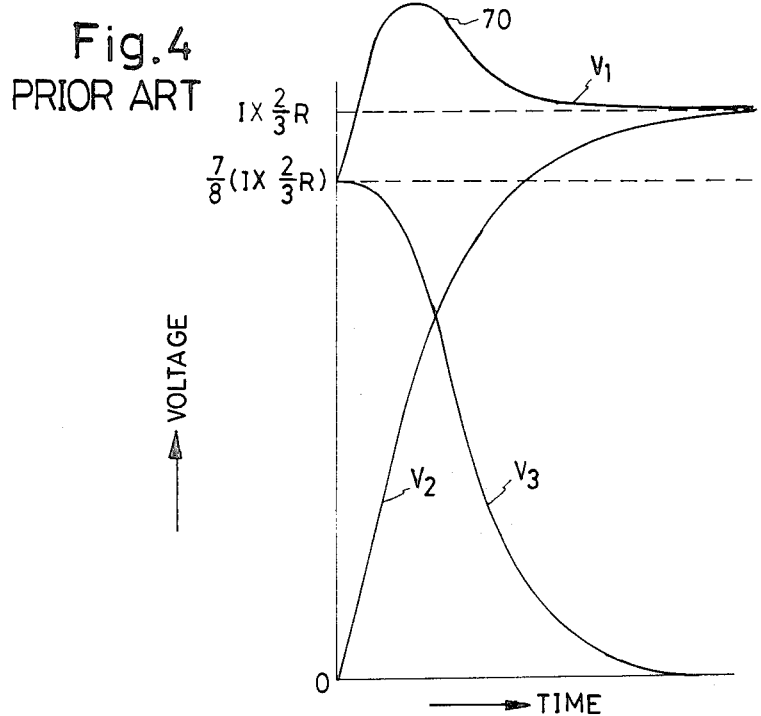
FIG. 4 shows the manner in which a glitch or transient spike will be developed at the converter output.

Further, it should be appreciated that the division of the voltage developed at each input port by the impedances Z and 2Z will eliminate any difference in relative phase delay while evenly decrementing the reference currents by a factor of 2 per stage as they flow toward the output port 32. As a result, transitions at any input ports of the ladder network resulting from the switching of corresponding current switches will cause corresponding changes in the voltage at the output port of the ladder network at very close to the same time because of no differential time delay, with the net result that there are no or, substantially no, glitches in the analog output. In the conventional circuit arrangement of FIG. 1, logic transitions at input terminals of the converter 10 can couple current spikes through the collector-base capacitances of switching transistors into the output terminal. For example, logic transitions from 0111 to 1000 will cause a 300 millivolts spike or glitch, with the value $I \times 2/3R$ being equal to 2 volts. With the arrangement of FIG. 3, this spike can be reduced to as low as approximately 50 millivolts.

Figure 2:
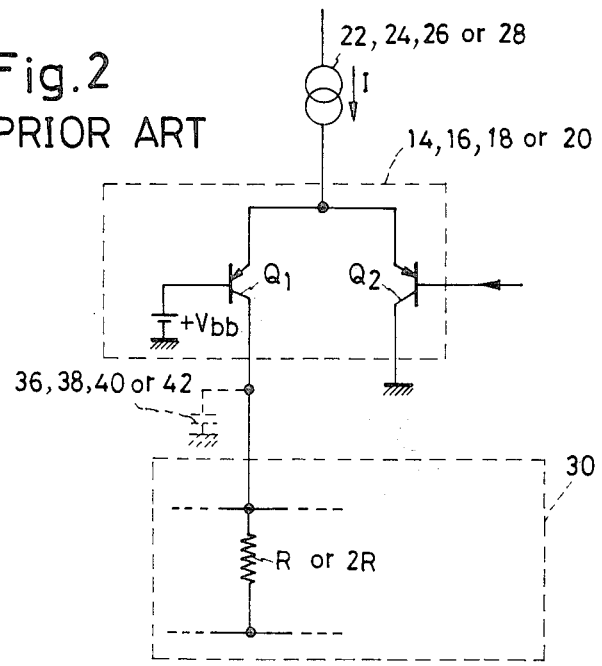
FIG. 2 is an electrical schematic of a prior art current switch intended for use in digital to analog converters.

Numerous features and advantages of the present invention have been set forth in the foregoing description, together with details of structure and function of the invention. The disclosure, however, is illustrative only, and changes may be made in detail without deviating from the true scope of the invention. For example, adjustable capacitors can be utilized as the compensating capacitors of values C and 2C to precisely match the stray capacitance of the current switches involved. In addition, if the resistance and capacitance of the load connected to the output of the converter are not negligible, the resistance value of the resistor 58 and the capacitance value of the compensating capacitor 82, both connected to the output port 32 of the ladder network, should be selected taking into account the impedance of the load so that the resultant resistance and capacitance will be equal to the values R and C, respectively. Moreover, the current switches can be comprised of FET's rather than bipolar transistors as employed in the prior art switch of FIG. 2.

I claim:

1. In a digital to analog converter for converting digital input signals, each including a plurality of bits, to corresponding electrical analog output signals, comprising a plurality of current switches corresponding to the number of bits of the digital input signals and selectively rendered conductive in response to digitial input bit signals of a given digital input signal, means for supplying a reference current to the plurality of current switches, and an impedance network having a plurality of input ports each being connected to the output terminal of a corresponding current switch and an output port, the impedance network receiving the outputs of the current switches when the latter are rendered conductive and decrementing the respective current switch outputs as they flow toward the output port to produce an analog output signal for each digital input signal, each current switch having a stray capacitance occurring between its output terminal and a common potential point, which capacitance causes variations in the impedance network as viewed from each input port toward the outport port, the improvement comprising:
   means for affording impedance equalization to provide an identical time delay for the outputs of the current switches flowing through the respective input ports to the output port of the network;
   wherein each current switch comprises a balanced transistor switching means having two branches each including a switching transistor and operated by the reference current, the switching transistor in one branch receiving the digital input bit signal and the switching transistor in the other branch receiving a threshold adjustment voltage, the switching of transistors being alternately turned on to switch the reference current between the two branches in response to the digital input bit signal, the stray capacitance of each current switch resuting from the parasitic collector-base capacitance of the switching transistor in the other branch.

2. A digital to analog converter as recited in claim 1 wherein the impedance network comprises an R-2R ladder network including a plurality of resistors of value R each being connected between two adjacent ones of the input ports, a resistor of value R connected between the input port for the least significant bit and the common potential point, a resistor of value R connected between the input port for the most significant bit and the common potential point, and a plurality of resistors of value 2R each being connected between a corresponding one of the input ports associated with the bit positions except the least and most significant bits and the common potential point, the input port for the most significant bit serving as the output port of the R-2R ladder network.

3. A digital to analog converter as recited in claim 2 wherein the means for affording impedance equalization comprises a compensating capacitor of value C connected between the input port for the least significant bit and the common potential point, another compensating capacitor of value C connected between the input port for the most significant bit and the common potential point, and a plurality of third compensating capacitors of value 2C each being connected in parallel to a corresponding one of the R resistors connected between two adjacent ones of the input ports, the value C being equal to the stray capacitance of each current switch connected to a corresponding input port of the R-2R ladder network.

4. A digital to analog converter as recited in claim 3 wherein the means for supplying a reference current comprises a plurality of constant current sources each being connected to a corresponding one of the current switches.

5. In a digital to analog converter for converting digital input signals, each including a plurality of bits, to corresponding electrical analog output signals, comprising a plurality of current switches corresponding to the number of bits of the digital input signals and selectively rendered conductive in response to digital input bit signals of a given digital input signal, means for supplying a reference current to the plurality of current switches and an R-2R ladder network having a plurality of input ports each being connected to the output terminal of a corresponding current switch and an output port, the R-2R ladder network comprising a plurality of resistors of value R each being connected between two adjacent ones of the input ports, a resistor of value R connected between the input port for the least significant bit and a common potential point, a resistor of value R connected between the input port for the most significant bit and the common potential point, and a plurality of resistors of value 2R each being connected between a corresponding one of the input ports associated with the bit position except the least and most significant bits and the common potential point, the input port for the most significant bit serving as the output port of the R-2R ladder network, the ladder network receiving the outputs of the current switches when the ladder are rendered conductive and decrementing the respective current switch outputs as they flow toward the output port to produce an analog output signal for each digital input signal, each current switch having a stray capacitance of value C between its output terminal and the common potential point, which capacitance causes variations in the impedance of the R-2R ladder network as viewed from each input port toward the output port, the improvement comprising:

means for affording impedance equalization to provide an identical time delay for the outputs of the current swtiches flowing through the respective input ports to the output port of the network, said impedance equalization means further comprising first and second compensating capacitors of value C connected between the input ports for the least and most significant bits respectively, and the common potential point, and a plurality of third compensating capacitors of value 2C each being connected and parallel to a corresponding one of the R resistors connected between two adjacent ones of the input ports of the R-2R ladder network.

6. A digital to analog converter as recited in claim 5 wherein each current switch comprises a balanced transistor switching means having two branches each including a switching transistor and operated by the reference current, the switching transistor in one branch receiving the digital input bit signal and the switching transistor in the other branch receiving a threshold adjustment voltage, the switching transistors being alternately turned on to switch the reference current between the two branches in response to the digital input bit signal, the stray capacitance of each current switch resulting from the parasitic collector-base capacitance of the switching transistor in the other branch.

7. A digital to analog converter as recited in claim 5 wherein the means for supplying a reference current comprises a plurality of constant current sources each being connected to a corresponding one of the current switches.

* * * * *